US011548030B2

(12) United States Patent
Ohta et al.

(10) Patent No.: US 11,548,030 B2
(45) Date of Patent: Jan. 10, 2023

(54) VIBRATION DEVICE

(71) Applicant: TDK CORPORATION, Tokyo (JP)

(72) Inventors: Yoshiki Ohta, Tokyo (JP); Kazushi Tachimoto, Tokyo (JP); Hideya Sakamoto, Tokyo (JP); Tetsuyuki Taniguchi, Tokyo (JP); Tatsuya Taki, Tokyo (JP); Tomohiro Takeda, Tokyo (JP); Akihiro Takeda, Tokyo (JP)

(73) Assignee: TDK CORPORATION, Tokyo (JP)

(*) Notice: Subject to any disclaimer, the term of this patent is extended or adjusted under 35 U.S.C. 154(b) by 334 days.

(21) Appl. No.: 16/759,593

(22) PCT Filed: Oct. 25, 2018

(86) PCT No.: PCT/JP2018/039667
§ 371 (c)(1),
(2) Date: Apr. 27, 2020

(87) PCT Pub. No.: WO2019/087922
PCT Pub. Date: May 9, 2019

(65) Prior Publication Data
US 2020/0282426 A1    Sep. 10, 2020

(30) Foreign Application Priority Data
Nov. 2, 2017 (JP) .............................. JP2017-213042

(51) Int. Cl.
*G01L 9/00* (2006.01)
*H01L 21/00* (2006.01)
(Continued)

(52) U.S. Cl.
CPC ........ *B06B 1/0603* (2013.01); *H01L 41/0474* (2013.01); *H01L 41/0475* (2013.01); *H01L 41/083* (2013.01); *H01L 41/094* (2013.01)

(58) Field of Classification Search
CPC .................... H01L 41/0474–0475; H04R 7/04
(Continued)

(56) References Cited

U.S. PATENT DOCUMENTS 9,544,694 B2 * 1/2017 Abe ........................ H04R 17/00
9,646,637 B1 * 5/2017 Xiong ................. H01L 41/0986
10,897,005 B2 * 1/2021 Kijima .................... H01L 41/09

FOREIGN PATENT DOCUMENTS

JP     H04-070100 A     3/1992
JP     2015-162728 A    9/2015
(Continued)

OTHER PUBLICATIONS

Jan. 8, 2019 International Search Report issued in International Patent Application No. PCT/JP2018/039667.
(Continued)

*Primary Examiner* — Calvin Lee
(74) *Attorney, Agent, or Firm* — Oliff PLC

(57) ABSTRACT

A piezoelectric element includes a piezoelectric element body including a first principal surface and a second principal surface opposing each other, and a plurality of external electrodes disposed on the first principal surface. A vibration member includes a third principal surface opposing the second principal surface. The piezoelectric element is joined to the third principal surface. A wiring member is electrically connected to the piezoelectric element. The wiring member includes a region located on the plurality of external electrodes and joined to the plurality of external electrodes. The region of the wiring member monolithically covers the plurality of external electrodes when viewed from a direction orthogonal to the first principal surface.

9 Claims, 12 Drawing Sheets

(51) Int. Cl.
*B06B 1/06* (2006.01)
*H01L 41/047* (2006.01)
*H01L 41/083* (2006.01)
*H01L 41/09* (2006.01)

(58) Field of Classification Search
USPC .............................. 438/52–53; 257/254, 419
See application file for complete search history.

(56) References Cited

FOREIGN PATENT DOCUMENTS

| WO | 2012/132661 A1 | 10/2012 | | |
|---|---|---|---|---|
| WO | 2014/097862 A1 | 6/2014 | | |
| WO | WO 2014/097862 | * | 6/2014 | ........... H01L 41/083 |

OTHER PUBLICATIONS

May 5, 2020 International Preliminary Report on Patentability issued in International Patent Application No. PCT/JP2018/039667.

* cited by examiner

VIBRATION DEVICE

TECHNICAL FIELD

The present invention relates to a vibration device.

BACKGROUND ART

Known piezoelectric device include a piezoelectric element, a vibration member joined to the piezoelectric element, and a wiring member electrically connected to the piezoelectric element (for example, refer to Patent Literature 1). The piezoelectric element includes a piezoelectric element body including a first principal surface and a second principal surface opposing each other, and a plurality of external electrodes disposed on the second principal surface. The vibration member includes a third principal surface opposing the second principal surface, and a plurality of conductors disposed on the third principal surface. The plurality of external electrodes is connected to the plurality of conductors, respectively.

CITATION LIST

Patent Literature

Patent Literature 1: Japanese Unexamined Patent Publication No. H04-070100

SUMMARY OF INVENTION

Technical Problem

In the vibration device disclosed in Patent Literature 1, since the external electrode and the conductor are located between the piezoelectric element and the vibration member, efficiency of transmitting displacement of the piezoelectric element to the vibration member is low. The external electrode and the conductor inhibit the transmission of the displacement of the piezoelectric element to the vibration member. Therefore, the displacement of the piezoelectric element is not appropriately transmitted to the vibration member. Consequently, a displacement amount of the vibration device decreases.

An object of one aspect of the present invention is to provide a vibration device with an improved displacement amount.

Solution to Problem

A vibration device according to one aspect of the present invention includes a piezoelectric element, a vibration member, and a wiring member. The piezoelectric element includes a piezoelectric element body including a first principal surface and a second principal surface opposing each other, and a plurality of external electrodes disposed on the first principal surface. The vibration member includes a third principal surface opposing the second principal surface. The wiring member is electrically connected to the piezoelectric element. The piezoelectric element is joined to the third principal surface. The wiring member includes a region located on the plurality of external electrodes and joined to the plurality of external electrodes. The region of the wiring member monolithically covers the plurality of external electrodes when viewed from a direction orthogonal to the first principal surface.

In the one aspect, the plurality of external electrodes is disposed on the first principal surface. The second principal surface of the piezoelectric element body is not covered with the external electrodes. The region joined to the plurality of external electrodes is located above the plurality of external electrodes. The external electrode and the wiring member are not located between the second principal surface and the third principal surface joined to each other. Therefore, the one aspect improves efficiency of transmitting displacement of the piezoelectric element to the vibration member. The displacement of the piezoelectric element is appropriately transmitted to the vibration member. Consequently, the one aspect improves a displacement amount of the vibration device.

As a result of researches and studies, the present inventors have discovered the following matters.

In the vibration device, residual vibration may occur. The residual vibration is a phenomenon in which the vibration of the vibration member is not immediately attenuated immediately after the vibration device (piezoelectric element) transitions from a driving state to a non-driving state. For example, in a case where the vibration device is applied to an actuator for providing a haptic sense, the vibration device may have the following problem. In a case where the residual vibration occurs in the vibration device, the vibration device tends not to provide an appropriate haptic sense.

In the one aspect, the region of the wiring member monolithically covers the plurality of external electrodes when viewed from a direction orthogonal to the first principal surface. The wiring member serves to attenuate the residual vibration. Therefore, in the one aspect, an area of the wiring member (the region) when viewed from the direction orthogonal to the first principal surface is large, so that a function of attenuating the residual vibration is high, as compared with in a configuration in which the wiring member (the region) independently covers the plurality of external electrodes when viewed from the direction orthogonal to the first principal surface. Consequently, the one aspect reduces the residual vibration.

In the one aspect, the first principal surface may include a surface region located between the plurality of external electrodes when viewed from the direction orthogonal to the first principal surface. The region of the wiring member may be joined to the surface region of the first principal surface. In this case, the region of the wiring member tends not to peel off from the piezoelectric element. Therefore, this configuration reliably reduces the residual vibration.

In the one aspect, a spacer may be disposed between the region of the wiring member and the surface region of the first principal surface. In this case, a gap between the region of the wiring member and the surface region of the first principal surface tends not to vary. Therefore, a joining state between the region of the wiring member and the piezoelectric element is stabilized, and the region of the wiring member further tends not to peel off from the piezoelectric element.

In the one aspect, the piezoelectric element body may include a piezoelectrically active region in a region located between the plurality of external electrodes when viewed from the direction orthogonal to the first principal surface. In this case, the displacement of the piezoelectric element is improved. Therefore, this configuration further improves the displacement amount of the vibration device.

In one aspect, the wiring member may include a base made of resin, a plurality of conductors, and a cover made of resin. In the region of the wiring member, the base may oppose the first principal surface of the piezoelectric element body, and the base and the first principal surface may be joined by a resin. In this case, the plurality of conductors is disposed on the base to be connected to the plurality of external electrodes, respectively. The cover is disposed on the base to cover the plurality of conductors. In this configuration, a joining area between the wiring member (the region) and the piezoelectric element is large, and joining strength between the wiring member (the region) and the piezoelectric element is improved.

In the one aspect, a resin may be present between the external electrodes and the conductors corresponding to each other. The external electrodes and the conductors corresponding to each other may be connected by metal particles disposed in the resin. This configuration establishes electrical connection between the external electrode and the conductor without impairing the joining strength between the wiring member (the region) and the piezoelectric element.

In one aspect, each of the piezoelectric element and the vibration member may have a rectangular shape including a pair of long sides and a pair of short sides in a planar view. The wiring member may be disposed to intersect with the long sides. This configuration easily secures the joining area between the region of the wiring member and the piezoelectric element, as compared with a configuration in which the wiring member is disposed to intersect with the short sides. Therefore, this configuration secures the joining strength between the region of the wiring member and the piezoelectric element and controls peel-off between the region of the wiring member and the piezoelectric element.

Advantageous Effects of Invention

One aspect of the present invention provides a vibration device with an improved displacement amount.

DESCRIPTION OF EMBODIMENTS

Figure 1:
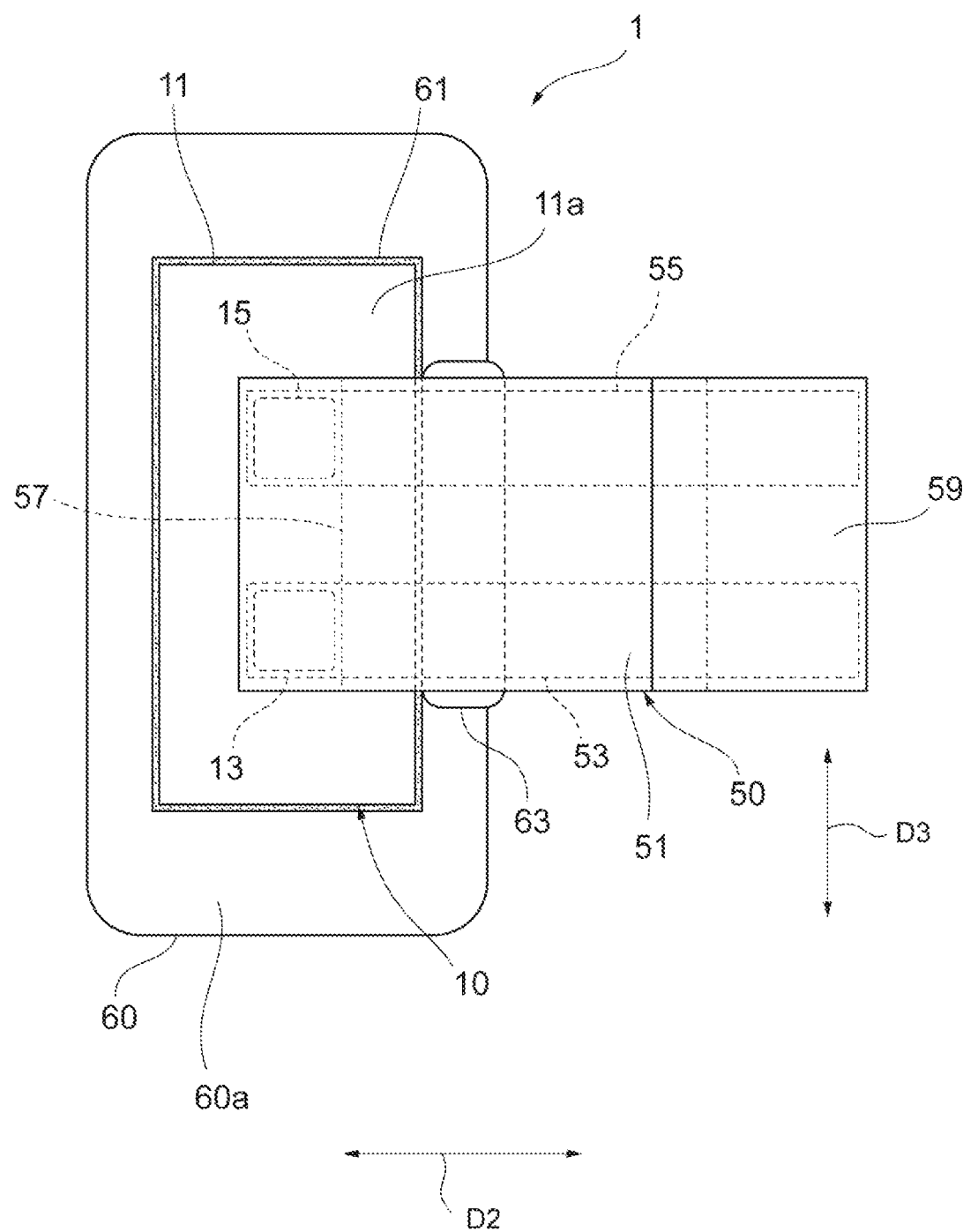
FIG. 1 is a plan view of a vibration device according to an embodiment.

Embodiments of the present invention will be hereinafter described in detail with reference to the accompanying drawings. In the description, the same reference numerals are used for the same elements or elements having the same functions, and redundant descriptions thereabout are omitted.

Figure 2:
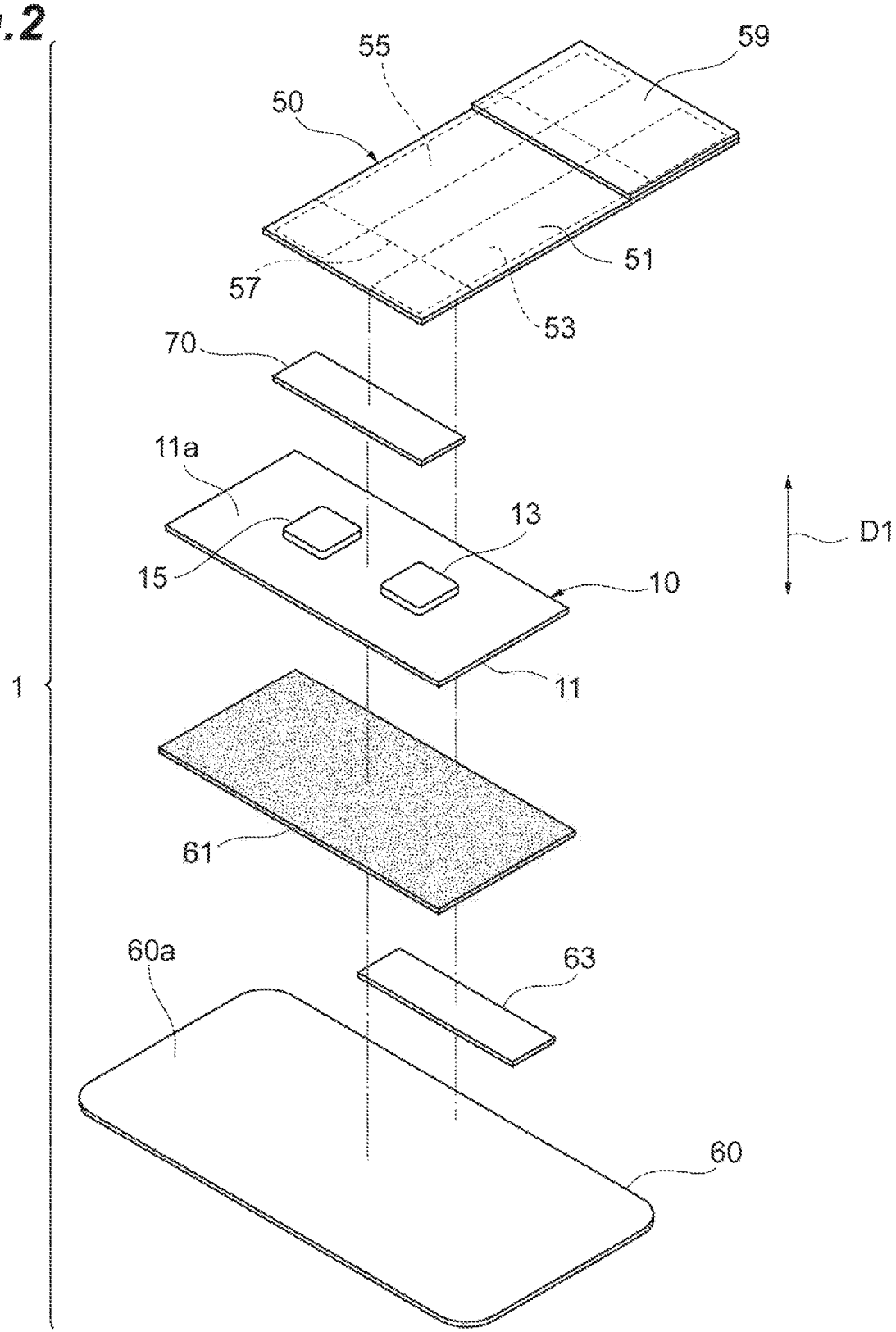
FIG. 2 is an exploded perspective view of the vibration device according to the embodiment.
Figure 3:
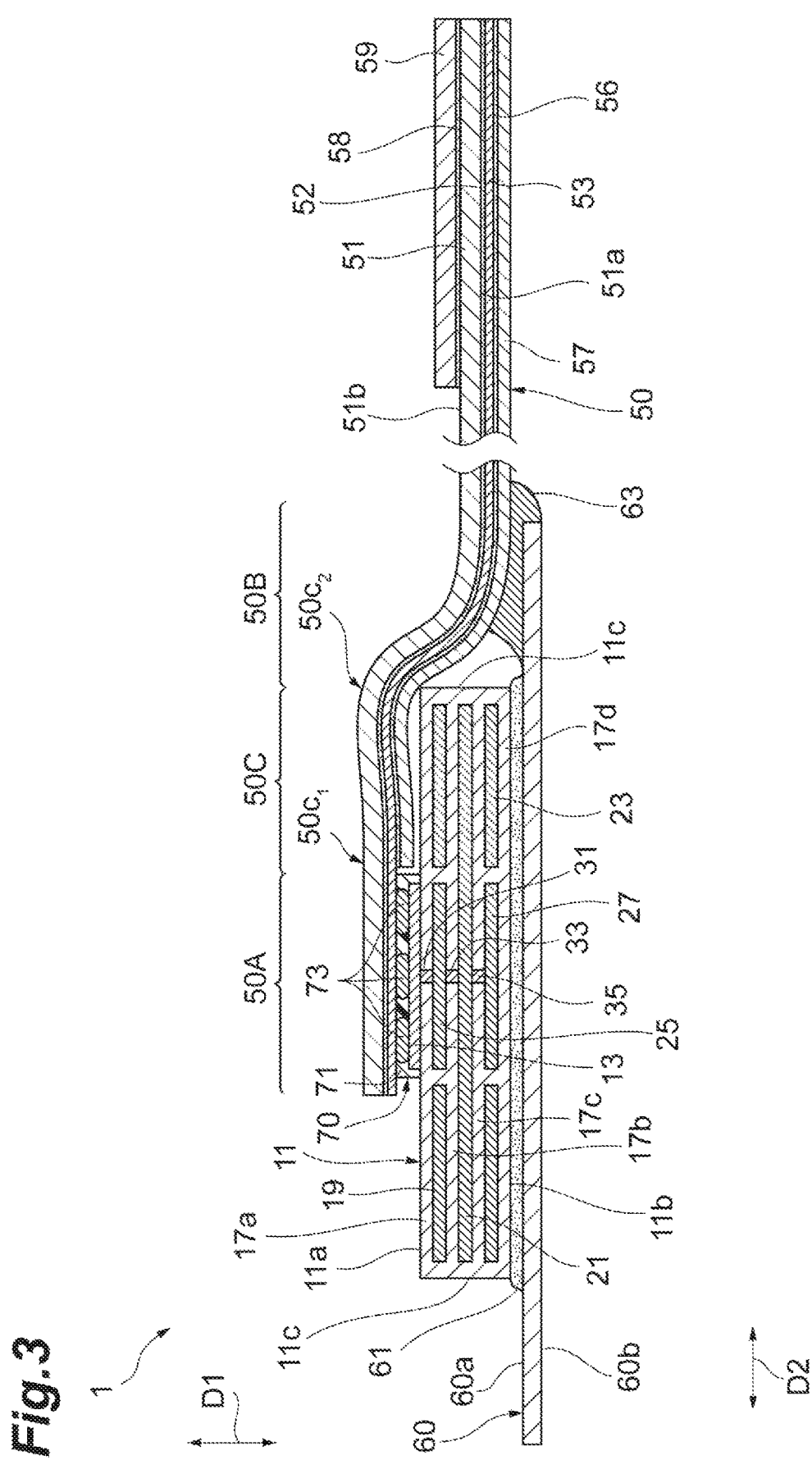
FIG. 3 is a view illustrating a cross-sectional configuration of the vibration device according to the embodiment.
Figure 4:
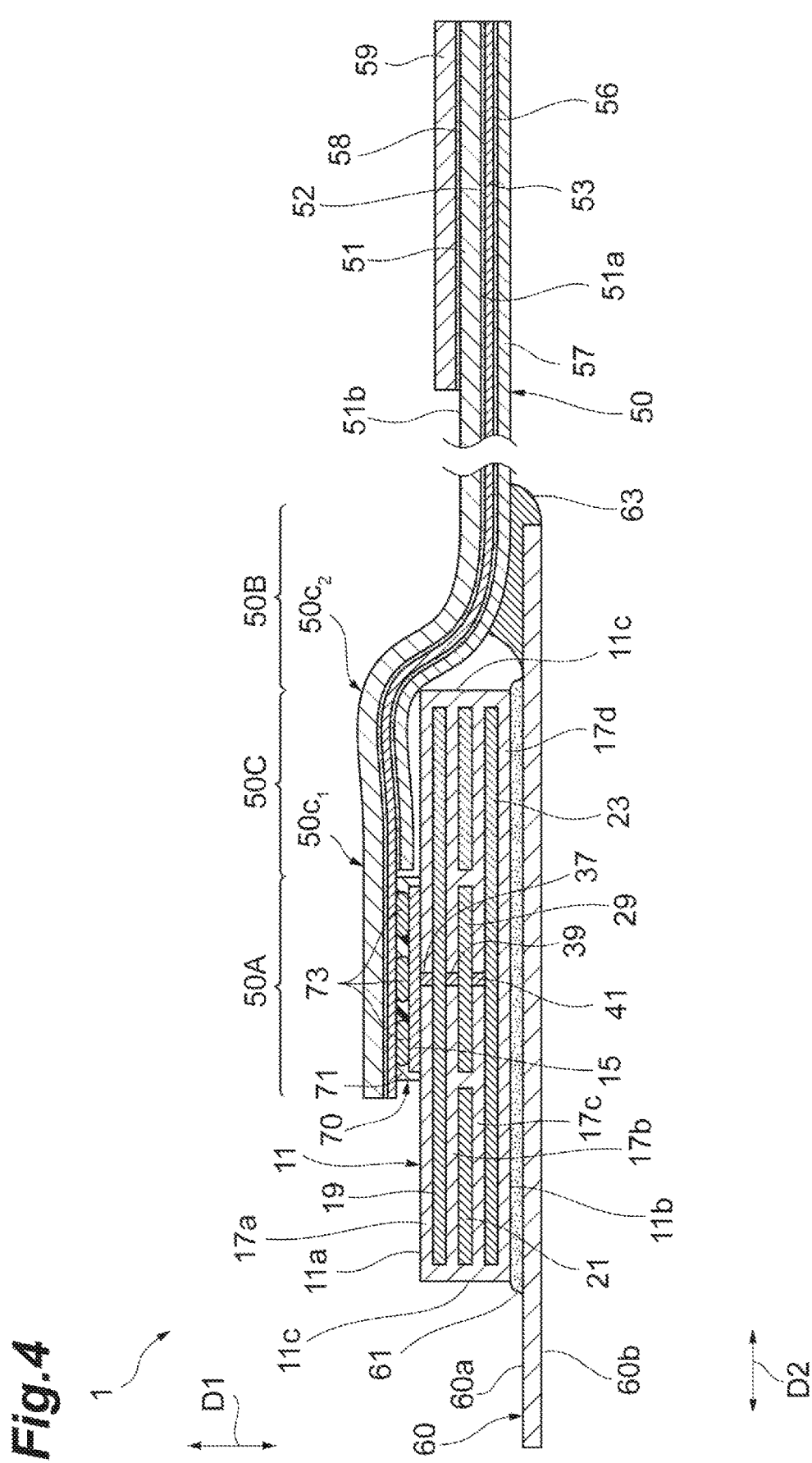
FIG. 4 is a view illustrating a cross-sectional configuration of the vibration device according to the embodiment.
Figure 5:
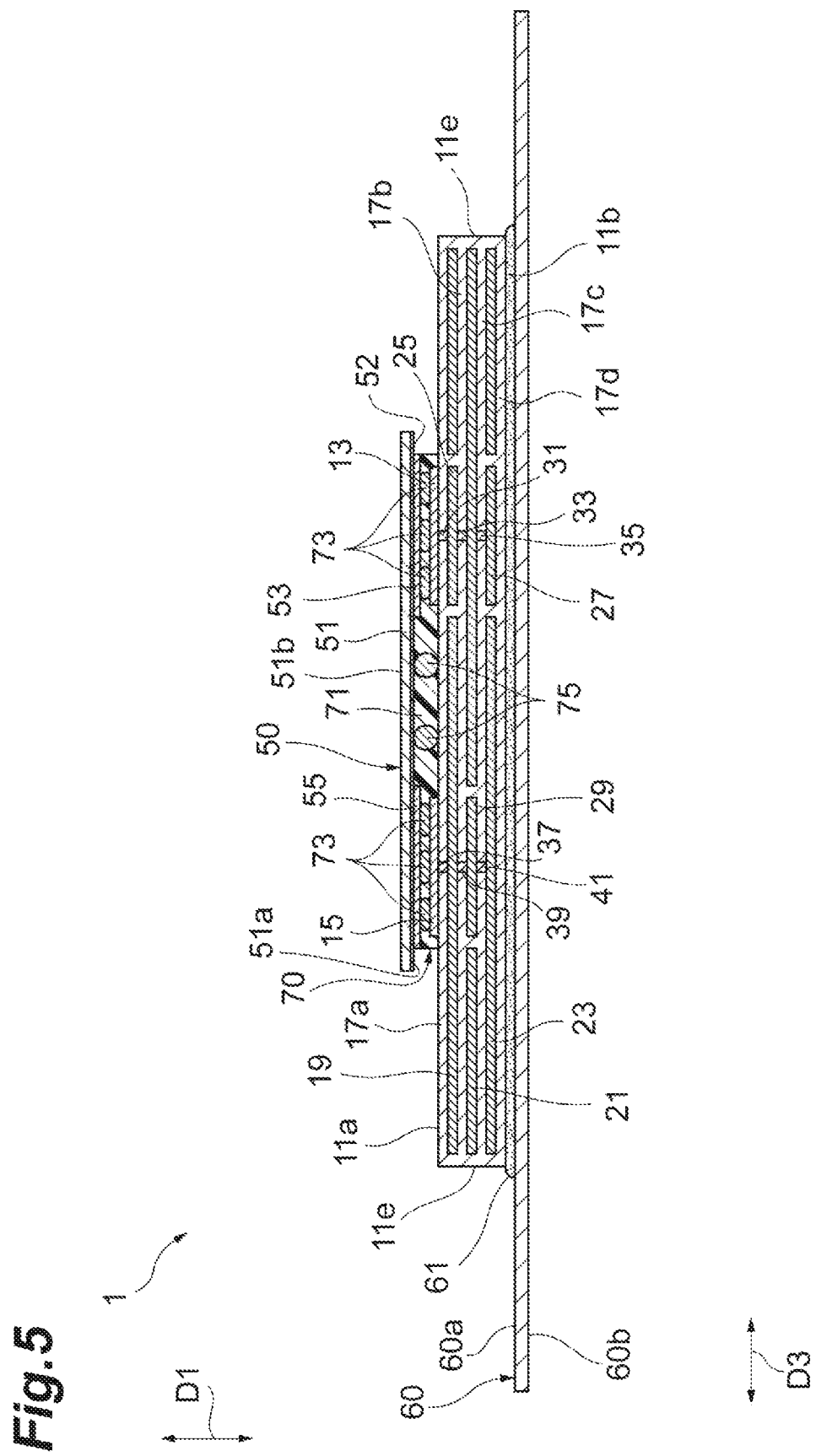
FIG. 5 is a view illustrating a cross-sectional configuration of the vibration device according to the embodiment.
Figure 6:
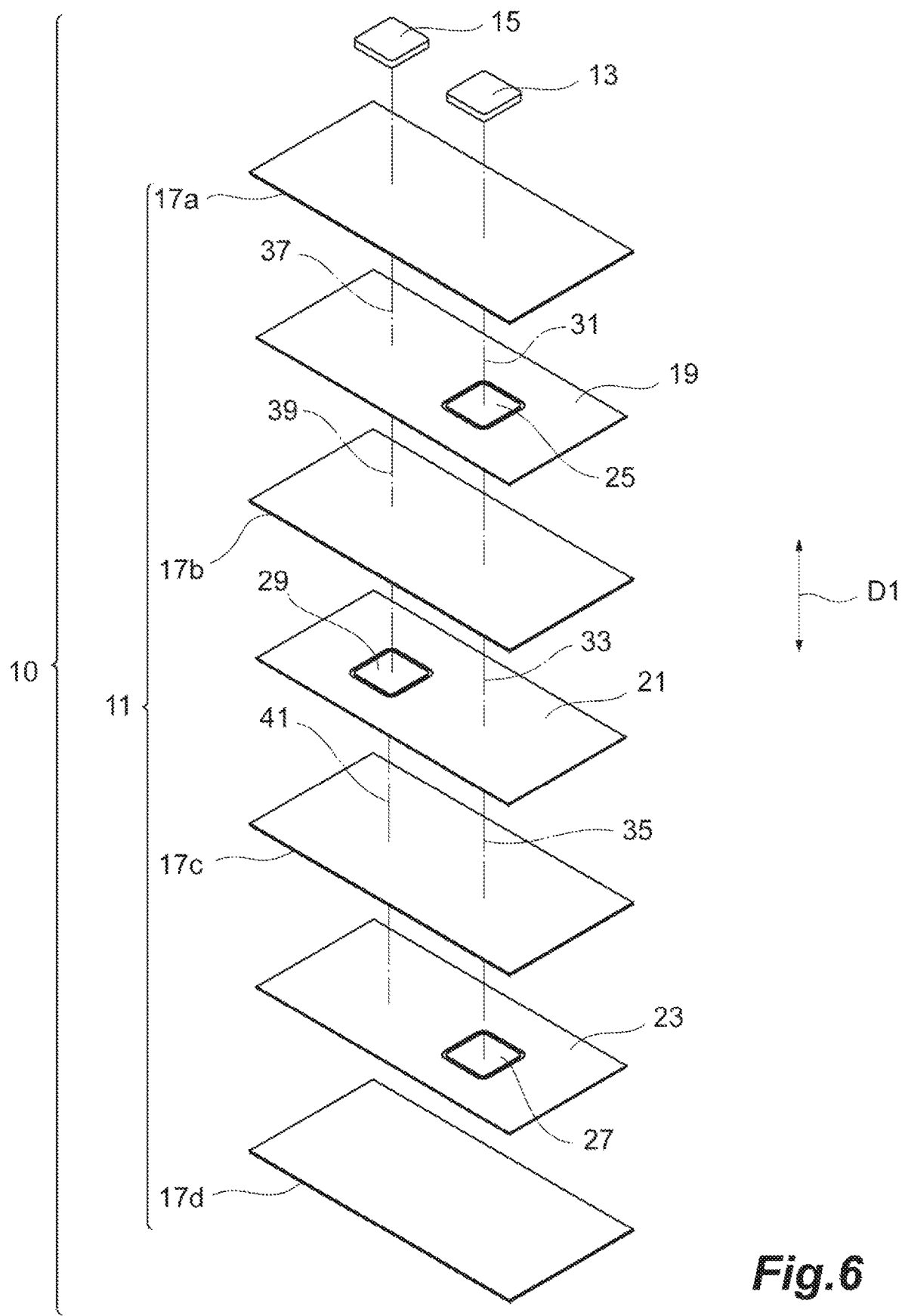
FIG. 6 is an exploded perspective view illustrating a configuration of a piezoelectric element.

A configuration of a vibration device 1 according to an embodiment will be described with reference to FIGS. 1 to 6. FIG. 1 is a plan view of the vibration device according to the embodiment. FIG. 2 is an exploded perspective view of the vibration device according to the embodiment. FIGS. 3, 4, and 5 are views illustrating a cross-sectional configuration of the vibration device according to the embodiment. FIG. 6 is an exploded perspective view illustrating a configuration of a piezoelectric element.

The vibration device 1 is provided with a piezoelectric element 10, a wiring member 50, and a vibration member 60 as illustrated in FIGS. 1 and 2. The piezoelectric element 10 includes a piezoelectric element body 11 and a plurality of external electrodes 13 and 15. In the present embodiment, the piezoelectric element 10 includes the two external electrodes 13 and 15.

The piezoelectric element body 11 has a rectangular parallelepiped shape. The piezoelectric element body 11 includes a pair of principal surfaces 11a and 11b opposing each other, a pair of side surfaces 11c opposing each other, and a pair of side surfaces 11e opposing each other. The rectangular parallelepiped shape includes, for example, a rectangular parallelepiped shape in which corners and ridges are chamfered, and a rectangular parallelepiped shape in which corners and ridges are rounded. A direction in which the pair of principal surfaces 11a and 11b opposes each other is a first direction D1. The first direction D1 is a direction orthogonal to each of the principal surfaces 11a and 11b. A direction in which the pair of side surfaces 11c opposes each other is a second direction D2. The second direction D2 is a direction orthogonal to each of the side surfaces 11c. A direction in which the pair of side surfaces 11e opposes each other is a third direction D3. The third direction D3 is a direction orthogonal to each of the side surfaces 11e.

Each of the principal surfaces 11a and 11b includes a pair of long sides and a pair of short sides. Each of the principal surfaces 11a and 11b has a rectangular shape having the pair of long sides and the pair of short sides. That is, the piezoelectric element 10 (piezoelectric element body 11) has a rectangular shape having the pair of long sides and the pair of short sides in a planar view. The rectangular shape includes, for example, a shape in which each corner is chamfered and a shape in which each corner is rounded. In the present embodiment, a long side direction of the principal surfaces 11a and 11b coincides with the third direction D3. A short side direction of the principal surfaces 11a and 11b coincides with the second direction D2.

The pair of side surfaces 11c extends in the first direction D1 to couple the pair of principal surfaces 11a and 11b. The pair of side surfaces 11c extends in the third direction D3. The pair of side surfaces 11e extends in the first direction D1 to couple the pair of principal surfaces 11a and 11b. The pair of side surfaces 11e extends in the second direction D2. A length of the piezoelectric element body 11 in the second direction D2 is, for example, 10 mm. A length of the piezoelectric element body 11 in the third direction D3 is, for example, 20 mm. A length of the piezoelectric element body 11 in the first direction D1 is, for example, 200 μm. The principal surfaces 11a and 11b and the side surfaces 11c and 11e may be indirectly adjacent to each other. In this case, the ridge portion is located between each of the principal surfaces 11a and 11b and each of the side surfaces 11c and 11e.

As illustrated in FIGS. 3 to 6, the piezoelectric element body 11 is configured by laminating a plurality of piezoelectric body layers 17a, 17b, 17c, and 17d in the first direction D1. The piezoelectric element body 11 includes the plurality of laminated piezoelectric body layers 17a, 17b, 17c, and 17d. In the present embodiment, the piezoelectric element body 11 includes the four piezoelectric body layers 17a, 17b, 17c, and 17d. In the piezoelectric element body 11, a direction in which the plurality of piezoelectric body layers 17a, 17b, 17c, and 17d is laminated coincides with the first direction D1. The piezoelectric body layer 17a includes the principal surface 11a. The piezoelectric body layer 17d includes the principal surface 11b. The piezoelectric body layers 17b and 17c are located between the piezoelectric body layers 17a and 17d.

Each of the piezoelectric body layers 17a, 17b, 17c, and 17d is made of a piezoelectric material. In the present embodiment, each of the piezoelectric body layers 17a, 17b, 17c, and 17d is made of a piezoelectric ceramic material. The piezoelectric ceramic material includes, for example, $PZT[Pb(Zr,Ti)O_3]$, $PT(PbTiO_3)$, $PLZT[(Pb,La)(Zr,Ti)O_3]$, or barium titanate ($BaTiO_3$). Each of the piezoelectric body layers 17a, 17b, 17c, and 17d is configured as, for example, a sintered body of a ceramic green sheet including the above-described piezoelectric ceramic material. In the actual piezoelectric element body 11, the piezoelectric body layers 17a, 17b, 17c, and 17d are integrated with one another such that boundaries between the piezoelectric body layers 17a, 17b, 17c, and 17d cannot be visually recognized.

The piezoelectric element 10 includes a plurality of internal electrodes 19, 21, and 23 disposed in the piezoelectric element body 11 as illustrated in FIGS. 3 to 6. In the present embodiment, the piezoelectric element 10 includes the three internal electrodes 19, 21, and 23. Each of the internal electrodes 19, 21, and 23 is made of a conductive material. The conductive material includes, for example, Ag, Pd, or an Ag—Pd alloy. Each of the internal electrodes 19, 21, and 23 is configured as, for example, a sintered body of a conductive paste including the above-described conductive material. In the present embodiment, an outer shape of each of the internal electrodes 19, 21, and 23 is a rectangular shape.

The internal electrodes 19, 21, and 23 are disposed in different positions (layers) in the first direction D1. The internal electrodes 19 and 21 oppose each other in the first direction D1 with an interval therebetween. The internal electrodes 21 and 23 oppose each other in the first direction D1 with an interval therebetween. The internal electrode 19 is located between the piezoelectric body layer 17a and the piezoelectric body layer 17b. The internal electrode 21 is located between the piezoelectric body layer 17b and the piezoelectric body layer 17c. The internal electrode 23 is located between the piezoelectric body layer 17c and the piezoelectric body layer 17d. Each of the internal electrodes 19, 21, and 23 is not exposed on a surface of the piezoelectric element body 11. That is, each of the internal electrodes 19, 21, and 23 is not exposed on each of the side surfaces 11c and 11e. Each of the internal electrodes 19, 21, and 23 is separated from all edges (four sides) of the principal surfaces 11a and 11b when viewed from the first direction D1.

In a case where an element is described as opposing another element, the element may directly oppose the other element, and the element may indirectly oppose the other element. In a case where the element indirectly opposes the other element, an intervening element is present between the element and the other element. In a case where the element directly opposes the other element, no intervening element is present between the element and the other element.

Each of the external electrodes 13 and 15 is disposed on the principal surface 11a. The external electrode 13 and the external electrode 15 are distributed in the third direction D3. The external electrodes 13 and 15 are adjacent to each other in the third direction D3. Each of the external electrodes 13 and 15 is separated from all the edges (four sides) of the principal surface 11a when viewed from the first direction D1. Each of the external electrodes 13 and 15 has a rectangular shape when viewed from the first direction D1. The rectangular shape includes, for example, a shape in which each corner is chamfered, and a shape in which each corner is rounded. Each of the external electrodes 13 and 15 is made of a conductive material. The conductive material includes, for example, Ag, Pd, or an Ag—Pd alloy. Each of the external electrodes 13 and 15 is configured as, for example, a sintered body of a conductive paste including the above-described conductive material. In the present embodiment, the external electrodes 13 and 15 are directly disposed on the principal surface 11a. The external electrode 13 and the external electrode 15 are separated from each other on the principal surface 11a. The principal surface 11a includes a surface region located between the external electrode 13 and the external electrode 15 when viewed from the first direction D1.

The external electrode 13 is electrically connected to a connection conductor 25 through a via conductor 31. The connection conductor 25 is located in the same layer as the internal electrodes 19. The connection conductor 25 is located on an inner side of the internal electrode 19. An opening is formed on the internal electrode 19 in a position corresponding to the external electrode 13 when viewed from the first direction D1. The connection conductor 25 is located in the opening formed on the internal electrode 19. When viewed from the first direction D1, an entire edge of the connection conductor 25 is surrounded by the internal electrode 19.

The connection conductor 25 is located between the piezoelectric body layer 17a and the piezoelectric body layer 17b. The internal electrode 19 and the connection conductor 25 are separated from each other. The connection conductor 25 opposes the external electrode 13 in the first direction D1. The via conductor 31 is connected to the external electrode 13 and to the connection conductor 25. The connection conductor 25 is electrically connected to the internal electrode 21 through a via conductor 33. The connection conductor 25 opposes the internal electrode 21 in the first direction D1. The via conductor 33 is connected to the connection conductor 25 and to the internal electrode 21.

The internal electrode 21 is electrically connected to a connection conductor 27 through a via conductor 35. The connection conductor 27 is located in the same layer as the internal electrode 23. The connection conductor 27 is located on an inner side of the internal electrode 23. An opening is formed on the internal electrode 23 in a position corresponding to the external electrode 13 (connection conductor 25) when viewed from the first direction D1. The connection conductor 27 is located in the opening formed on the internal electrode 23. When viewed from the first direction D1, an entire edge of the connection conductor 27 is surrounded by the internal electrode 23. The internal electrode 23 and the connection conductor 27 are separated from each other.

The external electrode 15 is electrically connected to the internal electrode 19 through a via conductor 37. The internal electrode 19 opposes the external electrode 15 in the first direction D1. The via conductor 37 is connected to the external electrode 15 and to the internal electrode 19.

The internal electrode 19 is electrically connected to a connection conductor 29 through a via conductor 39. The connection conductor 29 is located in the same layer as the internal electrode 21. The connection conductor 29 is located on an inner side of the internal electrode 21. An opening is formed on the internal electrode 21 in a position corresponding to the external electrode 15 when viewed from the first direction D1. The connection conductor 29 is located in the opening formed on the internal electrode 21. When viewed from the first direction D1, an entire edge of the connection conductor 29 is surrounded by the internal electrode 21.

The connection conductor 29 is located between the piezoelectric body layer 17b and the piezoelectric body layer 17c. The internal electrode 21 and the connection conductor 29 are separated from each other. The connection conductor 29 opposes the internal electrode 19 in the first direction D1. The via conductor 39 is connected to the internal electrode 19 and to the connection conductor 29. The connection conductor 29 is electrically connected to the internal electrode 23 through a via conductor 41. The connection conductor 29 opposes the internal electrode 23 in the first direction D1. The via conductor 41 is connected to the connection conductor 29 and to the internal electrode 23.

The external electrode 13 is electrically connected to the internal electrode 21 through the via conductor 31, the connection conductor 25, and the via conductor 33. The external electrode 15 is electrically connected to the internal electrode 19 through the via conductor 37. The external electrode 15 is electrically connected to the internal electrode 23 through the via conductor 37, the internal electrode 19, the via conductor 39, the connection conductor 29, and the via conductor 41.

Each of the connection conductors 25, 27, and 29 and the via conductors 31, 33, 35, 37, 39, and 41 is made of a conductive material. The conductive material includes, for example, Ag, Pd, or an Ag—Pd alloy. Each of the connection conductors 25, 27, and 29 and the via conductors 31, 33, 35, 37, 39, and 41 is configured as, for example, a sintered body of a conductive paste including the above-described conductive material. Each of the connection conductors 25, 27, and 29 has a rectangular shape. The via conductors 31, 33, 35, 37, 39, and 41 are formed by sintering the conductive paste filled into through holes formed on the ceramic green sheets for obtaining the corresponding piezoelectric body layers 17a, 17b, and 17c.

A conductor electrically connected to the internal electrodes 19 and 23 and a conductor electrically connected to the internal electrode 21 are not disposed on the principal surface 11b of the piezoelectric element body 11. In the present embodiment, when the principal surface 11b is viewed from the first direction D1, an entire principal surface 11b is exposed. The principal surfaces 11a and 11b are natural surfaces. The natural surfaces are constituted by surfaces of crystal grains grown by firing.

The conductor electrically connected to the internal electrodes 19 and 23 and the conductor electrically connected to the internal electrodes 21 are not disposed on the side surfaces 11c and 11e of the piezoelectric element body 11 either. In the present embodiment, when each side surface 11c is viewed from the second direction D2, an entire side surface 11c is exposed. When each side surface 11e is viewed from the third direction D3, an entire side surface 11e is exposed. In the present embodiment, each of the side surfaces 11c and 11e is also a natural surface.

A region located between the internal electrodes 19 and 21 in the piezoelectric body layer 17b and a region located between the internal electrodes 21 and 23 in the piezoelectric body layer 17c constitute piezoelectrically active regions. In the present embodiment, the piezoelectrically active region is located to surround the plurality of external electrodes 13 and 15 when viewed from the first direction D1. When viewed from the first direction D1, the piezoelectric element body 11 includes the piezoelectrically active region in a region located between the external electrode 13 and the external electrode 15. When viewed from the first direction D1, the piezoelectric element body 11 also includes the piezoelectrically active region outside the region where the external electrode 13 and the external electrode 15 are located.

The wiring member 50 includes a base 51, a plurality of conductors 53 and 55, a cover 57, and a reinforcing member 59, as illustrated in FIGS. 3 to 5. In the present embodiment, the wiring member 50 includes a pair of conductors 53 and 55. The wiring member 50 is, for example, a flexible printed circuit (FPC). The wiring member 50 is disposed to intersect with the long sides of the principal surfaces 11a and 11b. A direction in which the wiring member 50 extends intersects with the third direction D3. In the present embodiment, the wiring member 50 is disposed to be orthogonal to the long sides of the principal surfaces 11a and 11b. The direction in which the wiring member 50 extends is orthogonal to the third direction D3. The wiring member 50 extends in the second direction D2. The wiring member 50 includes one end and another end. The one end is electrically and physically connected to the piezoelectric element 10. The other end is electrically and physically connected to an electronic device (not illustrated) on which the vibration device 1 is mounted.

The base 51 includes a pair of principal surfaces 51a and 51b opposing each other. The base 51 has an electrical insulation property. The base 51 is made of, for example, a resin. The base 51 is made of, for example, a polyimide resin.

The pair of conductors 53 and 55 is disposed on the base 51 (principal surface 51a). The pair of conductors 53 and 55 is joined to the base 51 by an adhesive layer 52. The adhesive layer 52 is located between each of the conductors 53 and 55 and the base 51. The conductors 53 and 55 extend in the direction in which the wiring member 50 extends. The conductors 53 and 55 are separated from each other in a direction intersecting with the direction in which the conductors 53 and 55 extend. Each of the conductors 53 and 55 is made of, for example, copper. In the present embodiment, the pair of conductors 53 and 55 is indirectly disposed on the base 51.

In a case where an element is described as being disposed on another element, the element may be directly disposed on the other element or indirectly disposed on the other element. In a case where the element is indirectly disposed on the other element, an intervening element is present between the element and the other element. In a case where the element is directly disposed on the other element, no intervening element is present between the element and the other element.

The cover 57 is disposed on the conductors 53 and 55. The cover 57 covers a part of each of the conductors 53 and 55. The conductors 53 and 55 are exposed from the cover 57 at the one end and the other end of the wiring member 50. The cover 57 is also disposed on the principal surface 51a. The cover 57 covers a region exposed from the conductors 53 and 55 of the base 51. The cover 57 is joined to the conductors 53 and 55 by an adhesive layer 56. In the present embodiment, the cover 57 indirectly covers the part of each of the conductors 53 and 55.

In a case where an element is described as covering another element, the element may directly cover the other element or indirectly cover the other element. In a case where the element indirectly covers the other element, an intervening element is present between the element and the other element. In a case where the element directly covers the other element, no intervening element is present between the element and the other element.

The base 51 is exposed from the cover 57 at the one end and the other end of the wiring member 50. The base 51 and the cover 57 are joined to each other at the region exposed from the conductors 53 and 55. The cover 57 is made of, for example, a resin. The cover 57 is made of, for example, a polyimide resin. For example, nickel plating and gold flash plating are applied to regions of the conductors 53 and 55 exposed from the cover 57.

The reinforcing member 59 is disposed on the other end of the wiring member 50. The reinforcing member 59 is disposed on the base 51 (principal surface 51b). The reinforcing member 59 is joined to the base 51 by an adhesive layer 58. The adhesive layer 58 is located between the reinforcing member 59 and the base 51. The reinforcing member 59 is a plate-shaped member having an electrical insulation property. The reinforcing member 59 is made of, for example, a polyimide resin.

The vibration member 60 includes a pair of principal surfaces 60a and 60b opposing each other as illustrated in FIGS. 3 to 5. In the present embodiment, the vibration member 60 is a plate-shaped member. The vibration member 60 is made of, for example, metal. The vibration member 60 is made of, for example, a Ni—Fe alloy, Ni, brass, or stainless steel. Each of the principal surfaces 60a and 60b includes a pair of long sides and a pair of short sides. Each of the principal surfaces 60a and 60b has a rectangular shape having the pair of long sides and the pair of short sides. That is, the vibration member 60 has a rectangular shape having the pair of long sides and the pair of short sides in a planar view. In the present embodiment, a long side direction of the principal surfaces 60a and 60b coincides with the third direction D3. A short side direction of the principal surfaces 60a and 60b coincides with the second direction D2. A length of the vibration member 60 in the second direction D2 is, for example, 15 mm. A length of the vibration member 60 in the third direction D3 is, for example, 30 mm. A length of the vibration member 60 in the first direction D1 is, for example, 100 μm.

The piezoelectric element 10 is joined to the vibration member 60 by a resin layer 61. The principal surface 11b of the piezoelectric element body 11 and the principal surface 60a of the vibration member 60 oppose each other. The resin layer 61 is located between the principal surface 11b and the principal surface 60a. The principal surface 11b and the principal surface 60a are joined to each other by the resin layer 61. The resin layer 61 is made of a resin (for example, an epoxy resin or an acrylic resin). The resin layer 61 includes no conductive filler and has an electrical insulation property. In a state in which the piezoelectric element 10 is joined to the vibration member 60, the first direction D1 is approximately the same as the direction in which the principal surface 60a and the principal surface 60b oppose each other. When viewed from the first direction D1, the piezoelectric element 10 is disposed approximately at the center of the vibration member 60 (principal surface 60a).

Figure 7:
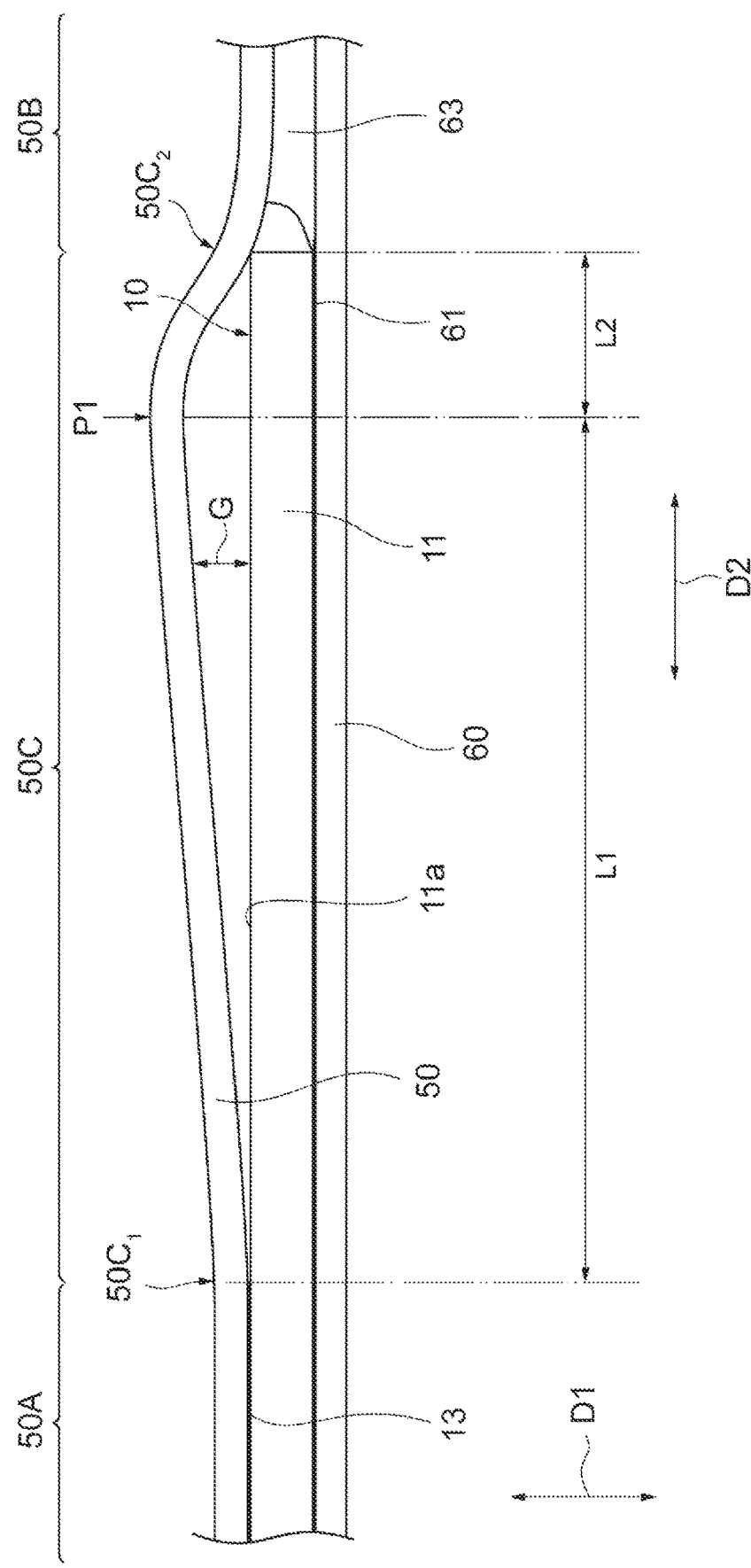
FIG. 7 is a schematic diagram illustrating a configuration of the vibration device according to the embodiment.

The wiring member 50 is disposed to intersect with the long sides of the principal surfaces 60a and 60b of the vibration member 60. In the present embodiment, the wiring member 50 is disposed to be orthogonal to the long sides of the principal surfaces 60a and 60b. The wiring member 50 includes three regions 50A, 50B, and 50C as illustrated in FIGS. 3, 4, and 7.

The region 50A is located above the external electrodes 13 and 15. The region 50A is included in the one end of the wiring member 50. The region 50A includes the base 51 and the conductors 53 and 55. The region 50A monolithically covers the external electrodes 13 and 15 when viewed from the first direction D1. The region 50A also covers the surface region of the principal surface 11a. The region 50A opposes the external electrodes 13 and 15 and the principal surface 11a (the surface region). In the region 50A, the conductors 53 and 55 are exposed. In the region 50A, the base 51 and the principal surface 11a oppose each other.

The region 50A is joined to the piezoelectric element 10 by a connecting member 70. The region 50A is joined to the external electrodes 13 and 15 by the connecting member 70. The connecting member 70 is disposed between the region 50A and the piezoelectric element 10. The connecting member 70 monolithically covers the external electrodes 13 and 15 when viewed from the first direction D1. The connecting member 70 includes a resin layer 71 and a plurality of metal particles 73. In the present embodiment, the resin layer 71 is present between the region 50A and the external electrodes 13 and 15 and principal surface 11a. The resin layer 71 is present between the external electrodes 13 and 15 and the conductors 53 and 55 that correspond to each other. The plurality of metal particles 73 is disposed in the resin layer 71. The resin layer 71 is made of, for example, a thermosetting elastomer. The metal particles 73 are formed of, for example, gold-plated particles. The connecting member 70 is formed, for example, by curing of an anisotropic conductive paste or an anisotropic conductive film.

The external electrodes 13 and 15 and the conductors 53 and 55 corresponding to each other are connected to each other by the metal particles 73. The external electrodes 13 and 15 and the conductors 53 and 55 corresponding to each other are electrically connected to each other through the metal particles 73. The conductor 53 is electrically connected to the internal electrode 21 through the metal particles 73 and the external electrode 13. The conductor 55 is electrically connected to the internal electrodes 19 and 23 through the metal particles 73 and the external electrode 15. In the present embodiment, the external electrodes 13 and 15 and the conductors 53 and 55 corresponding to each other are indirectly connected to each other.

In a case where an element is described as being connected to another element, the element may be directly connected to the other element or may be indirectly connected to the other element. In a case where the element is indirectly connected to the other element, an intervening element is present between the element and the other element. In a case where the element is directly connected to the other element, no intervening element is present between the element and the other element.

In the present embodiment, the region 50A is joined to the surface region of the principal surface 11a (the region located between the external electrodes 13 and 15 when viewed from the first direction D1) by the resin layer 71. In the region 50A, the base 51 (adhesive layer 52) is joined to the principal surface 11a by the resin layer 71. As illustrated in FIG. 5, at least one spacer 75 is disposed between the region 50A and the principal surface 11a (the surface region). The spacer 75 is disposed in the resin layer 71. A length of the spacer 75 in the first direction D1 is equivalent to an interval between the region 50A and the principal surface 11a (the surface region). The spacer 75 is made of, for example, a gold-plated particle.

The region 50B is located above the principal surface 60a of the vibration member 60. The region 50B includes the base 51, the conductors 53 and 55, and the cover 57. In the region 50B, the conductors 53 and 55 are not exposed. The region 50B is joined to the principal surface 60a. In the present embodiment, the region 50B is joined to the principal surface 60a by a resin layer 63. The cover 57 included in region 50B is joined to the principal surface 60a by the resin layer 63. A joining area between the vibration member 60 (principal surface 60a) and the region 50B (cover 57) is larger than a total value of an area of the external electrode 13 and an area of the external electrode 15.

The resin layer 63 is in contact with the resin layer 61. The resin layer 63 may be separated from the resin layer 61. The resin layer 63 may be in contact with a side surface of the vibration member 60. The resin layer 63 is not in contact with the principal surface 60b of the vibration member 60. That is, the resin layer 63 is not disposed on the principal surface 60b. The resin layer 63 is made of, for example, nitrile rubber. The resin layer 63 may be made of the same material as that of the resin layer 61. The resin layer 63 may be made of a material different from that of the resin layer 61.

The region 50C is located above the principal surface 11a of the piezoelectric element body 11 and between the regions 50A and 50B. In the present embodiment, the region 50C and the region 50A are continuous, and the region 50C and the region 50B are continuous. The region 50C is located between the region 50A and the region 50B. The region 50C includes a first end $50C_1$ and a second end $50C_2$. The first end $50C_1$ is located closer to the region 50A. The second end $50C_2$ is located closer to the region 50B. The region 50C includes the base 51, the conductors 53 and 55, and the cover 57. The region 50C has a shape convexly curved in a direction away from the principal surface 11a when viewed from the third direction D3.

As illustrated in FIG. 7, a gap G between the region 50C and the principal surface 11a is maximum at a position P1. The position P1 is located between the first end $50C_1$ and the second end $50C_2$. The gap G gradually decreases from the position P1 toward the first end $50C_1$. The gap G gradually decreases from the position P1 toward the second end $50C_2$. The gap G is a distance from the principal surface 11a to the region 50C in the first direction D1. For example, the gap G is a distance from the principal surface 11a to the cover 57 (not illustrated in FIG. 7) in the first direction D1. In the region 50C, the wiring member 50 extends in a direction intersecting with the principal surface 11a of the piezoelectric element body 11. A maximum value of the gap G (the gap G in the position P1) is, for example, 50 to 200 µm. In the present embodiment, the maximum value of the gap G is 80 µm. FIG. 7 illustrates only one external electrode (for example, the external electrode 13) of the plurality of external electrodes.

A distance L1 from the position P1 to the first end $50C_1$ is larger than a distance L2 from the position P1 to the second end $50C_2$. The distance L1 is a gap between the position P1 and the first end $50C_1$ along the second direction D2. The distance L2 is a gap between the position P1 and the second end $50C_2$ along the second direction D2. The second end $50C_2$ of the region 50C is in contact with an edge of the piezoelectric element body 11, that is, one side of the principal surface 11a. In the present embodiment, the region 50C is separated from the piezoelectric element body 11 (principal surface 11a) except for the second end $50C_2$. The distance L1 is, for example, 2.0 to 3.0 mm. In the present embodiment, the distance L1 is 2.5 mm. The distance L2 is, for example, 0.3 to 1.5 mm. In the present embodiment, the distance L2 is 1.0 mm.

In a case where voltages having different polarities are applied to the external electrode 13 and the external electrode 15 through the conductors 53 and 55, respectively, electric fields are generated between the internal electrode 21 and the internal electrodes 19 and 23. The region located between the internal electrodes 19 and 21 in the piezoelectric body layer 17b and the region located between the internal electrodes 21 and 23 in the piezoelectric body layer 17c form the piezoelectrically active regions, and displacement occurs in the piezoelectrically active regions. In a case where an AC voltage is applied to the external electrodes 13 and 15, the piezoelectric element 10 repeatedly expands and contracts in response to a frequency of the applied AC voltage. The piezoelectric element 10 and the vibration member 60 are joined to each other. Therefore, the vibration member 60 repeats flexural vibration monolithically with the piezoelectric element 10 in response to repetition of expansion and contraction of the piezoelectric element 10.

As described above, in the present embodiment, the wiring member 50 is joined to the vibration member 60 in the region 50B. Therefore, even in a case where the vibration device 1 vibrates, a mechanical load tends not to act on a joint between the region 50A and the external electrodes 13 and 15.

Also in a case where the region 50B is joined to the vibration member 60, a force may act from the region 50C on the joint between the region 50A and the external electrodes 13 and 15 along with the vibration of the vibration device 1. In this case, the force acting from the region 50C acts in a direction in which the region 50A peels off from the external electrodes 13 and 15. In a case where the region 50C is parallel to the principal surface 11a of the piezoelectric element body 11, that is, in a case where the gap G between the region 50C and the principal surface 11a is constant, the force acting from the region 50C is large. In a case where the gap G changes as follows, the force acting from the region 50C is small. The gap G gradually decreases from the position P1 toward the first end $50C_1$ and gradually decreases from the position P1 toward the second end $50C_2$.

In the vibration device 1, the gap G between the region 50C and the principal surface 11a changes as described above. Even in a case where the vibration device 1 vibrates, the force acting from the region 50C on the joint between the region 50A and the external electrodes 13 and 15 is small. Therefore, the mechanical load further tends not to act on the joint between the region 50A and the external electrodes 13 and 15. Peel-off between the region 50A and the external electrodes 13 and 15 tends not to occur. Consequently, the vibration device 1 secures electrical connection between the external electrodes 13 and 15 and the wiring member 50, and tends not to decrease electrical reliability of the vibration device 1.

In the vibration device 1, the second end $50C_2$ of the region 50C is in contact with the edge of the piezoelectric element body 11. In this case, a direction of the force acting from the region 50C on the joint between the region 50A and the external electrodes 13 and 15 tends not to change. Therefore, a force is controlled from acting on the joint between the region 50A and the external electrodes 13 and 15 in an unintended direction. The mechanical load further tends not to act on the joint between the region 50A and the external electrodes 13 and 15. Consequently, the vibration device 1 further tends not to decrease the electrical reliability of the vibration device 1.

In the vibration device 1, the distance L1 from the position P1 to the first end $50C_1$ is larger than the distance L2 from the position P1 to the second end $50C_2$. In this case, the force acting from the region 50C on the joint between the region 50A and the external electrodes 13 and 15 is smaller. Therefore, the vibration device 1 further tends not to decrease the electrical reliability of the vibration device 1.

In the vibration device 1, the joining area between the vibration member 60 and the region 50B is larger than a total area of the plurality of external electrodes 13 and 15. The vibration device 1 reduces the force acting from the region 50C on the joint between the region 50A and the external electrodes 13 and 15, as compared with a vibration device in which the joining area between the vibration member 60 and the region 50B is not larger than the total area of the plurality of external electrodes 13 and 15. Therefore, the vibration device 1 further tends not to decrease the electrical reliability of the vibration device 1.

In a case where the resin layers 61 and 63 are made of the same material, the piezoelectric element 10 and the wiring member 50 may be joined to the vibration member 60 in one process when the vibration device 1 is manufactured. In this case, a manufacturing process of the vibration device 1 is simplified.

In the vibration device 1, the wiring member 50 includes the base 51, the plurality of conductors 53 and 55, and the cover 57. The cover 57 is joined to the vibration member 60. The conductors 53 and 55 are disposed on the base 51, and are connected to the corresponding external electrodes 13 and 15. The cover 57 is disposed on the base 51 to cover the conductors 53 and 55. In the vibration device 1, even in a case where the vibration member 60 is made of a conductive member (for example, metal), the vibration member 60 and the conductors 53 and 55 are reliably electrically insulated.

In the vibration device 1, in the region 50A, the base 51 opposes the principal surface 11a of the piezoelectric element body 11, and the base 51 and the principal surface 11a are joined to each other by the resin layer 71. Therefore, in the vibration device 1, a joining area between the wiring member 50 (region 50A) and the piezoelectric element 10 is large, and joining strength between the wiring member 50 (region 50A) and the piezoelectric element 10 is improved. In the vibration device 1, the external electrodes 13 and 15 are covered with the resin layer 71. Therefore, the external electrodes 13 and 15 are reliably electrically insulated from each other on the principal surface 11a.

In the vibration device 1, each of the piezoelectric element 10 and the vibration member 60 has the rectangular shape having the pair of long sides and the pair of short sides in a planar view. The wiring member 50 is disposed to intersect with the long sides. The vibration device 1 easily secures the joining area between the vibration member 60 and the region 50B, as compared with a vibration device in which the wiring member 50 is disposed to intersect with the short sides. Therefore, the vibration device 1 secures the joining strength between the vibration member 60 and the wiring member 50, and controls peel-off between the vibration member 60 and the wiring member 50. The vibration device 1 also easily secures the joining area between the region 50A and the piezoelectric element 10, as compared with the vibration device in which the wiring member 50 is disposed to intersect with the short sides. Therefore, the vibration device 1 secures the joining strength between the region 50A and the piezoelectric element 10 and controls peel-off between the region 50A and the piezoelectric element 10.

In the vibration device 1, the resin layer 71 is present between the external electrodes 13 and 15 and the conductors 53 and 55 corresponding to each other. The external electrodes 13 and 15 and the conductors 53 and 55 corresponding to each other are connected by the metal particles 73 disposed in the resin layer 71. Therefore, the vibration device 1 establishes electrical connection between the external electrodes 13 and 15 and the conductors 53 and 55 without impairing the joining strength between the wiring member 50 (region 50A) and the piezoelectric element 10.

In the vibration device 1, the plurality of external electrodes 13 and 15 is disposed on the principal surface 11a of the piezoelectric element body 11. The principal surface 11b of the piezoelectric element body 11 is not covered with the external electrodes 13 and 15. The region 50A joined to the plurality of external electrodes 13 and 15 is located above the plurality of external electrodes 13 and 15. The external electrodes 13 and 15 and the wiring member 50 are not located between the principal surface 11b of the piezoelectric element body 11 and the principal surface 60a of the vibration member 60 joined to each other. Therefore, the vibration device 1 increases efficiency of transmitting the displacement of the piezoelectric element 10 to the vibration member 60. The displacement of the piezoelectric element 10 is appropriately transmitted to the vibration member 60. Consequently, the vibration device 1 improves a displacement amount of the vibration device 1.

In the vibration device 1, residual vibration may occur. The residual vibration is a phenomenon in which the vibration of the vibration member 60 is not immediately attenuated immediately after the vibration device 1 (piezoelectric element 10) transitions from a driving state to a non-driving state. For example, in a case where the vibration device 1 is applied to an actuator for providing a haptic sense, the vibration device 1 may have the following problem. In a case where the residual vibration occurs in the vibration device 1, the vibration device 1 tends not to provide an appropriate haptic sense.

In the vibration device 1, the region 50A of the wiring member 50 monolithically covers the plurality of external electrodes 13 and 15 when viewed from the first direction D1. The wiring member 50 serves to attenuate the residual vibration. Therefore, in the vibration device 1, an area of the wiring member 50 (region 50A) when viewed from the first direction D1 is large, so that a function of attenuating the residual vibration is high, as compared with in a vibration device in which the wiring member 50 (region 50A) independently covers the plurality of external electrodes 13 and 15 when viewed from the first direction D1. Consequently, the vibration device 1 reduces the residual vibration.

In the vibration device 1, the region 50A of the wiring member 50 is joined to the surface region of the principal surface 11a (the region located between the external electrodes 13 and 15 when viewed from the first direction D1). Therefore, the region 50A tends not to peel off from the piezoelectric element 10. Consequently, the vibration device 1 reliably reduces the residual vibration.

In the vibration device 1, the spacer 75 is disposed between the region 50A of the wiring member 50 and the surface region of the principal surface 11a. Therefore, the gap between the region 50A and the surface region of the principal surface 11a tends not to vary. Consequently, a joining state between the region 50A and the piezoelectric element 10 is stabilized, and the region 50A further tends not to peel off from the piezoelectric element 10.

In the vibration device 1, the piezoelectric element body 11 includes the piezoelectrically active region in the region located between the external electrode 13 and the external electrode 15 when viewed from the first direction D1. Therefore, the displacement of the piezoelectric element 10 is improved. Consequently, the vibration device 1 further improves the displacement amount of the vibration device 1.

Although the embodiment of the present invention is described above, the present invention is not necessarily limited to the above-described embodiment, and various changes may be made without departing from the scope thereof.

Figure 8:
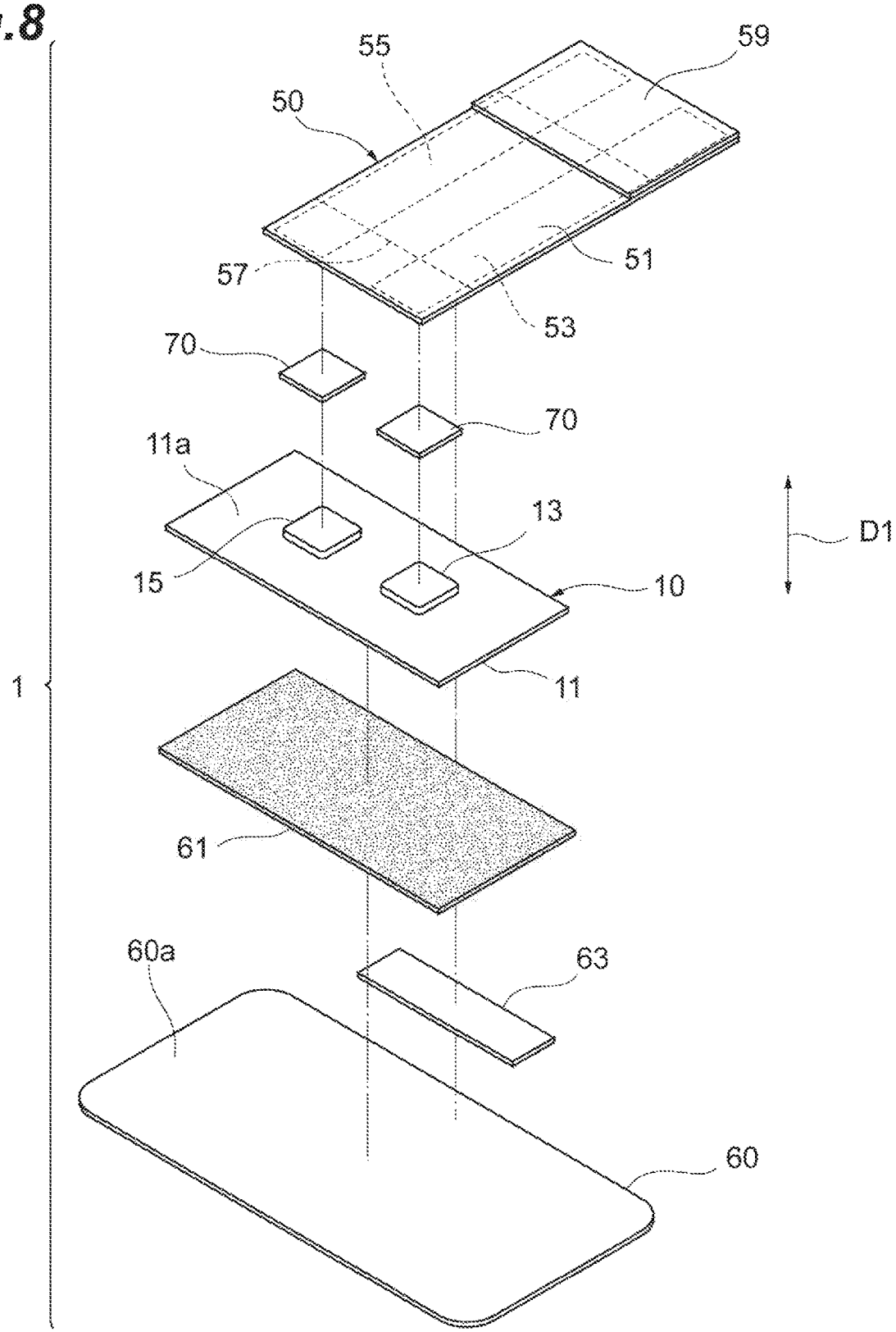
FIG. 8 is an exploded perspective view of a vibration device according to a modification of the embodiment.
Figure 9:
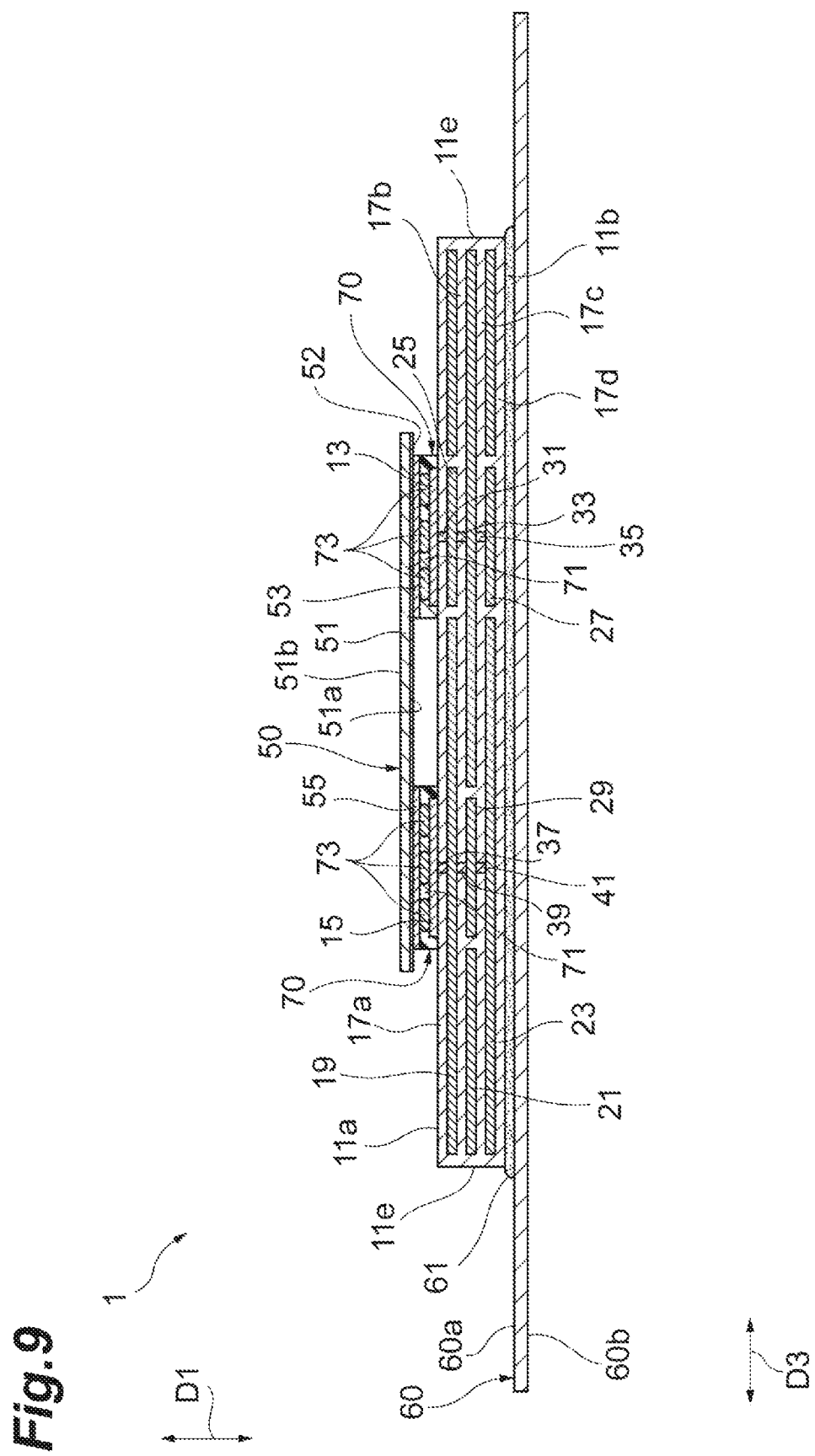
FIG. 9 is a view illustrating a cross-sectional configuration of the vibration device according to the modification of the embodiment.

The connecting member 70 may be disposed between the region 50A and the piezoelectric element 10 to separately cover the external electrodes 13 and 15 when viewed from the first direction D1. In this case, as illustrated in FIGS. 8 and 9, the vibration device 1 according to the modification includes a plurality of connecting members 70. The vibration device 1 according to the modification includes two connecting members 70. Each of the connecting members 70 includes the resin layer 71 and the plurality of metal particles 73. FIG. 8 is an exploded perspective view of the vibration device according to the modification. FIG. 9 is a view illustrating a cross-sectional configuration of the vibration device according to the modification. The modification illustrated in FIGS. 8 and 9 is different from the above-described embodiment in the configuration of the connecting member 70.

One connecting member 70 is disposed between the region 50A (conductor 53) and the external electrode 13. The one connecting member 70 covers the external electrode 13 when viewed from the first direction D1. The resin layer 71 of the one connecting member 70 is present between the conductor 53 and the external electrode 13. The metal particles 73 of the one connecting member 70 connect the conductor 53 to the external electrode 13. Another connecting member 70 is disposed between the region 50A (conductor 55) and the external electrode 15. The other connecting member 70 covers the external electrode 15 when viewed from the first direction D1. The resin layer 71 of the other connecting member 70 is present between the conductor 55 and the external electrode 15. The metal particles 73 of the other connecting member 70 connect the conductor 55 to the external electrode 15. In the modification, the base 51 and the principal surface 11a are not joined to each other by the resin layer 71 in the region 50A.

Figure 10:
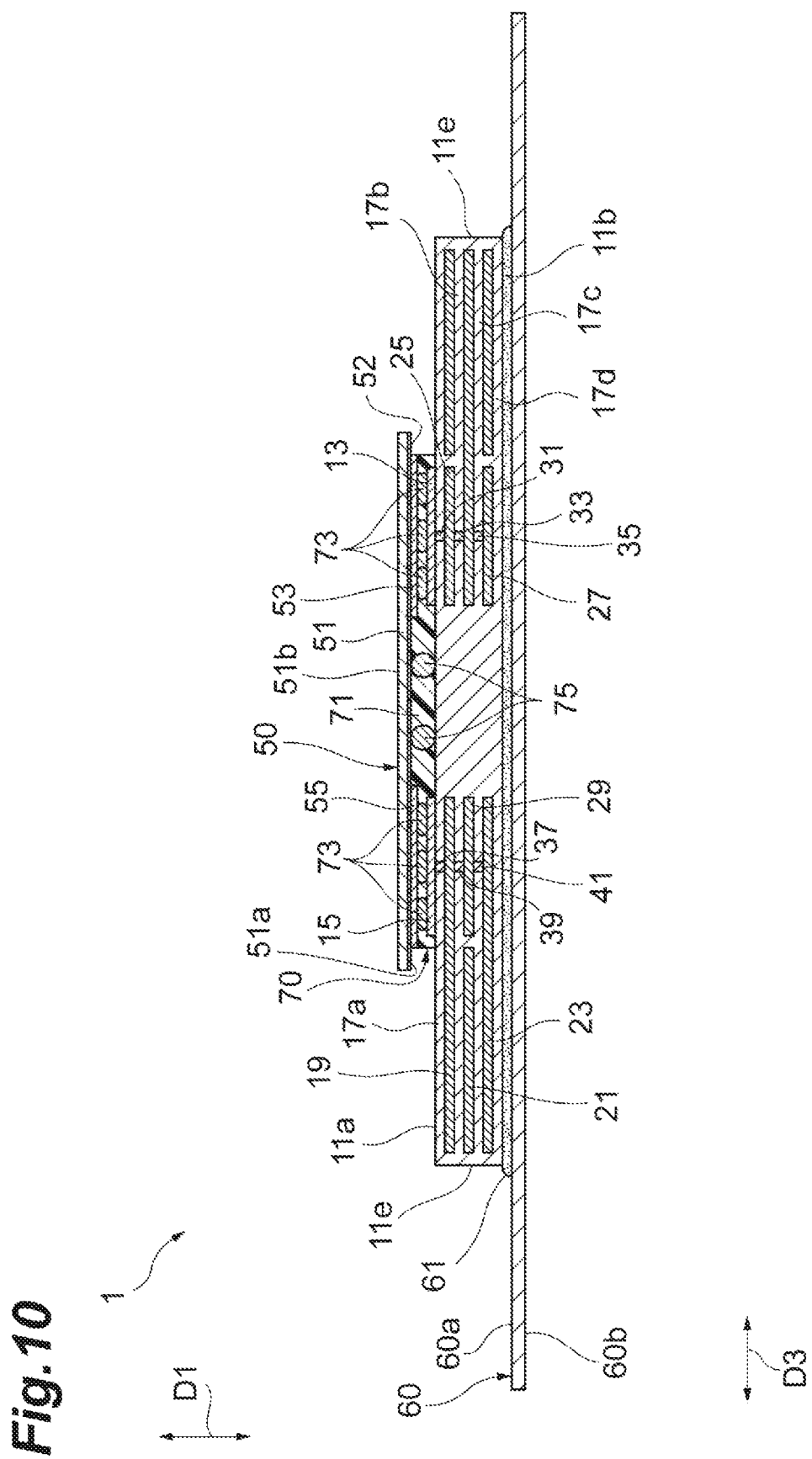
FIG. 10 is a view illustrating a cross-sectional configuration of the vibration device according to the modification of the embodiment.
Figure 11:
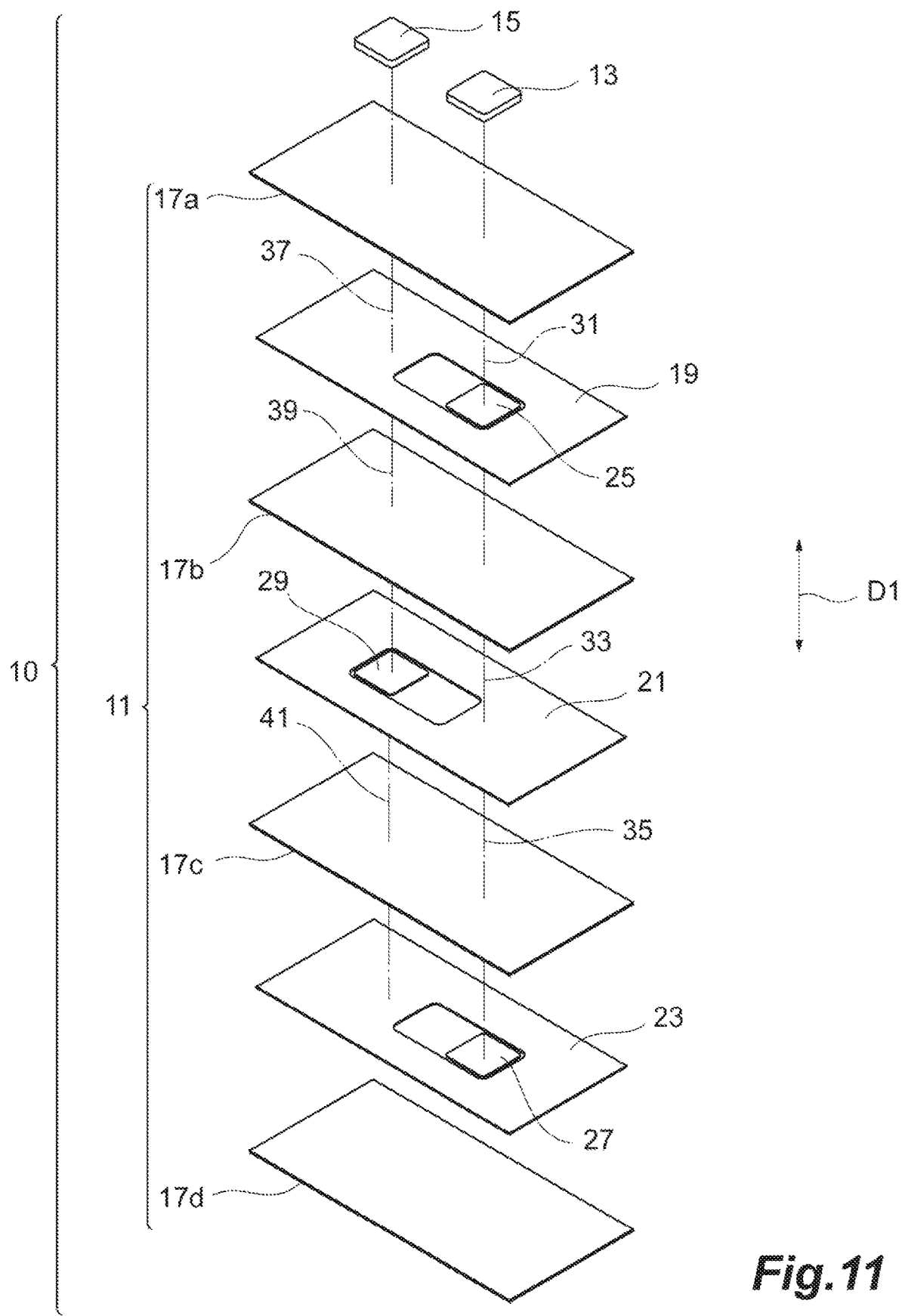
FIG. 11 is an exploded perspective view illustrating a configuration of a piezoelectric element.
Figure 12:
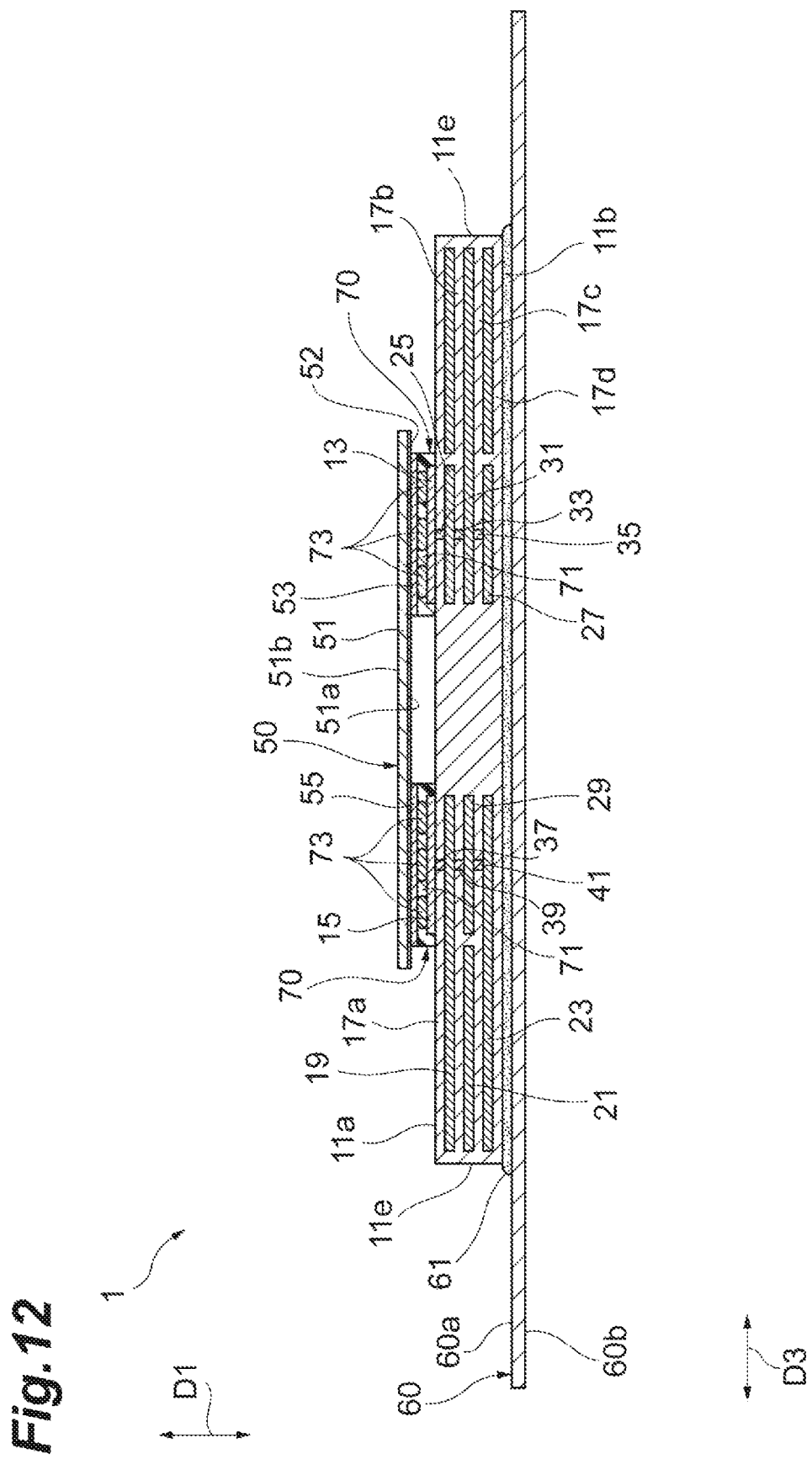
FIG. 12 is a view illustrating a cross-sectional configuration of the vibration device according to the modification of the embodiment.

The piezoelectric element body 11 may include no piezoelectrically active region in the region located between the external electrodes 13 and 15 when viewed from the first direction D1 as illustrated in FIGS. 10 to 12. FIG. 10 is a view illustrating a cross-sectional configuration of the vibration device according to the modification. FIG. 11 is an exploded perspective view illustrating a configuration of the piezoelectric element. FIG. 12 is a view illustrating a cross-sectional configuration of the vibration device according to another modification. The modification illustrated in FIGS. 10 and 11 is different from the above-described embodiment in shapes of the internal electrodes 19, 21, and 23. The modification illustrated in FIG. 12 differs from the modification illustrated in FIGS. 8 and 9 in shapes of the internal electrodes 19, 21, and 23.

The gap G may be constant, for example. In a case where the gap G gradually decreases from the position P1 toward the first end $50C_1$ and gradually decreases from the position P1 toward the second end $50C_2$, the vibration device 1 tends not to decrease the electrical reliability of the vibration device 1 as described above.

The second end $50C_2$ may be separated from the edge of the piezoelectric element body 11. In a case where the second end $50C_2$ is in contact with the edge of the piezoelectric element body 11, the vibration device 1 further tends not to decrease the electrical reliability of the vibration device 1 as described above.

The distance L1 may be equal to or smaller than the distance L2. In a case where the distance L1 is larger than the distance L2, the vibration device 1 further tends not to decrease the electrical reliability of the vibration device 1 as described above.

The joining area between the vibration member 60 and the region 50B may be equal to or smaller than the total area of the plurality of external electrodes 13 and 15. In a case where the joining area between the vibration member 60 and the region 50B is larger than the total area of the plurality of external electrodes 13 and 15, the vibration device 1 further tends not to decrease the electrical reliability of the vibration device 1 as described above.

The first end $50C_1$ of the region 50C may be in contact with the piezoelectric element body 11 (principal surface 11a).

The spacer 75 may not be disposed between the region 50A and the principal surface 11a. In a case where the spacer 75 is disposed between the region 50A and the principal surface 11a, the region 50A further tends not to peel off from the piezoelectric element 10 as described above.

The conductors 53 and 55 and the external electrodes 13 and 15 corresponding to each other may be joined by solder or a conductive resin.

The number of the internal electrodes 19, 21, and 23 included in the piezoelectric element 10, the number of the piezoelectric body layers 17a, 17b, 17c, and 17d, and the number of the external electrodes 13 and 15 are not limited to the numbers disclosed in the above-described embodiments and modifications. The piezoelectric element 10 and the vibration member 60 may be square in a planar view.

The vibration member 60 may be, for example, a housing of an electronic device. The vibration member 60 may be, for example, a member different from the housing of the electronic device. The vibration member 60 may be attached to the housing or another member by surface adhesion.

INDUSTRIAL APPLICABILITY

The present invention may be used for the vibration device including the piezoelectric element.

REFERENCE SIGNS LIST

1 Vibration device
10 Piezoelectric element
11 Piezoelectric element body
11a, 11b Principal surface
13, 15 External electrode
50 Wiring member
50A Region of wiring member
51 Base
53, 55 Conductor
57 Cover
60 Vibration member
60a, 60b Principal surface
70 Connecting member
71 Resin layer
73 Metal particle
D1 First direction

The invention claimed is:

1. A vibration device, comprising:
a piezoelectric element including a piezoelectric element body including a first principal surface and a second principal surface opposing each other, and a plurality of external electrodes disposed on the first principal surface;
a vibration member joined to the second principal surface of the piezoelectric element; and
a wiring member electrically connected to the piezoelectric element, the wiring member including:
a region located above the plurality of external electrodes and monolithically covering the plurality of external electrodes; and
a plurality of conductors each electrically connected to a corresponding external electrode of the plurality of external electrodes, the external electrodes and the conductors corresponding to each other being connected by electrically conductive particles disposed between the corresponding external electrodes and conductors.

2. A vibration device, comprising:
a piezoelectric element including a piezoelectric element body including a first principal surface and a second principal surface opposing each other, and a plurality of external electrodes disposed on the first principal surface;
a vibration member including a third principal surface opposing the second principal surface, the piezoelectric element being joined to the third principal surface; and
a wiring member electrically connected to the piezoelectric element, the wiring member including:
a region located above the plurality of external electrodes and joined to the plurality of external electrodes, the region monolithically covering an entirety of the plurality of external electrodes when viewed from a direction orthogonal to the first principal surface; and
a plurality of conductors each electrically connected to a corresponding external electrode of the plurality of external electrodes, the external electrodes and the conductors corresponding to each other being connected by electrically conductive particles disposed between the corresponding external electrodes and conductors.

3. A vibration device, comprising:
a piezoelectric element including:
a piezoelectric element body including a first principal surface and a second principal surface opposing each other; and
a plurality of external electrodes disposed on the first principal surface;
a vibration member including a third principal surface opposing the second principal surface, the piezoelectric element being joined to the third principal surface; and
a wiring member electrically connected to the piezoelectric element, the wiring member including:
a region located above the plurality of external electrodes and joined to the plurality of external electrodes, the region of the wiring member monolithically covering the plurality of external electrodes when viewed from a direction orthogonal to the first principal surface; and
a plurality of conductors each electrically connecting to a corresponding external electrode of the plurality of external electrodes, the external electrodes and the conductors corresponding to each other being connected by electrically conductive particles disposed between the corresponding external electrodes and conductors.

4. The vibration device according to claim 3, wherein the piezoelectric element body includes a piezoelectrically active region in a region located between the plurality of external electrodes when viewed from the direction orthogonal to the first principal surface.

5. The vibration device according to claim 3, wherein each of the piezoelectric element and the vibration member has a rectangular shape including a pair of long sides and a pair of short sides in a planar view, and the wiring member is disposed to intersect with the long sides.

6. The vibration device according to claim 3, wherein the wiring member further includes:
a base on which the plurality of conductors is disposed and that is made of resin;
a cover made of resin and disposed on the base to cover the plurality of conductors, and
in the region of the wiring member, the base opposes the first principal surface of the piezoelectric element body, and the base is joined to the first principal surface by a resin.

7. The vibration device according to claim 6, wherein the resin is present between the external electrodes and the conductors corresponding to each other, and
the electrically conductive particles include metal particles disposed in the resin.

8. The vibration device according to claim 3, wherein the first principal surface includes a surface region located between the plurality of external electrodes when viewed from the direction orthogonal to the first principal surface, and
the region of the wiring member is joined to the surface region of the first principal surface.

9. The vibration device according to claim 8, wherein a spacer is disposed between the region of the wiring member and the surface region of the first principal surface.

* * * * *